United States Patent [19]

Bartilson et al.

[11] Patent Number: 5,230,564
[45] Date of Patent: Jul. 27, 1993

[54] TEMPERATURE MONITORING SYSTEM FOR AIR-COOLED ELECTRIC COMPONENTS

[75] Inventors: Bradley W. Bartilson; Elliot F. Schlimme, both of Chippewa Falls, Wis.

[73] Assignee: Cray Research, Inc., Chippewa Falls, Wis.

[21] Appl. No.: 853,983

[22] Filed: Mar. 20, 1992

[51] Int. Cl.⁵ .............................................. G01K 7/00
[52] U.S. Cl. .................................. 374/178; 374/163; 361/383; 257/706; 257/467
[58] Field of Search ............... 374/163, 166, 172, 178, 374/183; 307/310; 357/28, 81, 82, 83; 361/380, 381, 382, 383, 384, 385; 257/706, 713, 467

[56] References Cited

U.S. PATENT DOCUMENTS

| | | |
|---|---|---|
| 3,141,999 | 7/1964 | Schneider . |
| 3,198,991 | 8/1965 | Barnett . |
| 3,420,104 | 1/1969 | Troemel et al. ............. 374/178 |
| 3,527,989 | 9/1970 | Cuzner et al. . |
| 3,737,728 | 6/1973 | Austin . |
| 3,741,292 | 6/1973 | Askalu et al. . |
| 3,812,717 | 5/1974 | Miller ........................ 374/178 |
| 3,851,221 | 11/1974 | Beaulieu et al. . |
| 3,996,451 | 12/1976 | Harrington ................. 374/178 |
| 3,999,105 | 12/1976 | Archey et al. . |
| 4,047,435 | 9/1977 | Keith ......................... 374/172 |
| 4,050,083 | 9/1977 | Jaskolski et al. ............ 374/178 |
| 4,104,700 | 8/1978 | Hutchison et al. . |
| 4,185,253 | 1/1980 | Lade et al. ................. 374/178 |
| 4,204,247 | 5/1980 | Wigley . |
| 4,283,754 | 8/1981 | Parks . |
| 4,450,472 | 5/1984 | Tuckerman et al. . |
| 4,535,385 | 8/1985 | August et al. . |
| 4,536,824 | 8/1985 | Barrett et al. . |
| 4,628,407 | 12/1986 | August et al. . |
| 4,758,926 | 7/1988 | Herrell et al. . |
| 4,854,731 | 8/1989 | Jenkins ...................... 374/178 |
| 4,914,742 | 4/1990 | Higashi et al. .............. 257/467 |
| 5,024,535 | 6/1991 | Winston, Jr. ............... 374/178 |
| 5,107,397 | 4/1992 | Azar .......................... 361/383 |

FOREIGN PATENT DOCUMENTS

| | | |
|---|---|---|
| 0129966 | 2/1988 | European Pat. Off. . |
| 59-19825 | 2/1984 | Japan ........................ 374/178 |
| 1274165 | 11/1986 | U.S.S.R. . |

OTHER PUBLICATIONS

"Impingement of a Simulated Electronics Package with a Square Array of Round Air Jets", T. Hamadah, HTD-vol. III, *Heat Transfer in Electronics*, pp. 107-112, 1989.

"On the Accommodation of Coolant Flow Paths in High-Density Packaging", W. Nakayama, InterSociety Conference on Thermal Phenomena, pp. 101-112, 1990.

"Heat-Transfer Microstructures for Integrated Circuits", D. Tuckerman, Stanford University, pp. 1-141, 1984.

(List continued on next page.)

Primary Examiner—William A. Cuchlinski, Jr.
Assistant Examiner—G. Bradley Bennett
Attorney, Agent, or Firm—Merchant, Gould, Smith, Edell, Welter & Schmidt

[57] ABSTRACT

A monitoring system for printed circuit boards which are air-cooled utilizes temperature sensors which have thermal diodes embedded directly into the integrated circuits. The thermal diodes are part of the fully-functioning integrated circuit which utilize voltages on the board for driving so that no added power sources are required. The thermal diode has a voltage which is inversely proportional to the temperature and can be calibrated so that a given voltage can be converted into a given temperature. This can be utilized by a logic controller to monitor and control cooling. Pressure sensors are also used with the temperature sensors to monitor air pressure along the ducts leading to the printed circuit boards. Pressure sensors also utilize voltages from the board for driving and have an amplification circuit to increase the signal. The pressure reading can also be utilized by a logic controller for controlling and monitoring the cooling of the boards.

17 Claims, 5 Drawing Sheets

OTHER PUBLICATIONS

"Impingement Cooling of Electronics: Effects of Venting Through Circuit Board", B. Hollworth et al., Alfred University, pp. 80–96.

"Heat Transfer From Pin-Fins Situated in an Oncoming Longitudinal Flow Which Turns to Crossflow", Sparrow et al., *Int. J. Heat Mass Transfer*, vol. 25, No. 5, pp. 603–614, 1982.

"Performance Comparisons Among Geometrically Different Pin-Fin Arrays Situated in an Oncoming Longitudinal Flow", Larson et al., *Int. J. Heat Mass Transfer*, vol. 25, No. 5, pp. 723–725, 1982.

"Experimental Investigation of Multi-Jet Impingement Cooling of an Array of Microelectronic Heat Sources", Jiji et al., The City College of the City University of New YOrk, pp. 1–32, 1986.

"High-Performance Heat Sinking for VLSI", Tuckerman et al., *IEEE Electron Device Letters*, vol. EDL-2, No. 5, pp. 126–129, 1981.

"Heat Transfer in Forced Convection Through Fins", R. Keyes, *IEEE Transactions on Electron Devices*, vol. ED-31, No. 9, pp. 1218–1221, 1984.

"Air Jet Impingement Cooling of an Array of Simulated Electronics Packages", T. Hamadah, HTD-vol. 111, *Heat Transfer in Electronics*, pp. 97–105, 1989.

"Impingement Cooling of Electronics", B. Hollworth et al., HTD-vol. 111, *Heat Transfer in Electronics*, pp. 89–96, 1989.

"Prediction of Surface Temperature and Heat Flux of a Microelectronic Chip with Jet Impingement Cooling", X. Wang et al., *Journal of Electronic Packaging*, vol. 112, pp. 57–62, 1990.

"Heat Transfer with Impinging Jets", R. Goldstein, *Proceedings of the Symposium on Nonlinear Problems in Energy Engineering*, Argon National Labs, pp. 7–15, 1983.

"Jet Impingement Flow Boiling of a Mixture of FC-72 and FC-87 Liquids on a Simulated Electronic Chip", T. Nonn et al., HTD-Vol. 111, *Heat Transfer in Electronics*, pp. 121–128, 1989.

"Local Heat Transfer Coefficients Under an Axisymmetric, Single-Phase Liquid Jet", J. Stevens et al., HTD-vol. 111, *Heat Transfer in Electronics*, pp. 113–119, 1989.

"Thermal Performance Characteristics of Air-Cooled Cold Plates for Electronic Cooling", B. Yimer et al., HTD-vol. 111, *Heat Transfer in Electronics*, pp. 143–148, 1989.

"Flow Visualization in an Impinging Circular Air Jet", A. Behbahani et al., HTD-vol. 112, *Heat Transfer Measurements, Analysis, and Flow Visualization*, pp. 143–148.

"Local Heat Transfer to Staggered Arrays of Impinging Circular Air Jets", A. Behbahani et al., *Transactions of the ASME*, vol. 105, pp. 354–359, 1983.

"IBM Packs in High Density Circuits", *Computer Design*, pp. 254–255, 1984.

"Effect of Inlet, Exit, and Fin Geometry on Pin Fins Situated in a Turning Flow", E. Sparrow et al., pp. 1039–1053, 1984.

"Forced-Convection, Liquid-Cooled, Microchannel Heat Sinks for High-Power-Density Microelectronics", R. Phillips et al., pp. 295–318.

"Thermal Impact of Double-Sided Printed Circuit Cards", T. Davis, IBM Systems Technology Division, pp. 11–15.

TEMPERATURE MONITORING SYSTEM FOR AIR-COOLED ELECTRIC COMPONENTS

BACKGROUND OF THE INVENTION

1. Field of the Invention

The present invention relates to an apparatus and method for directly measuring cooling air pressure and the temperature of an integrated circuit.

2. Description of the Prior Art

Measurement of integrated circuit board temperatures is critical for continuous operation without overheating and damaging the circuits. Integrated circuits may develop a build up of heat at various points in the circuit. If the temperature is too high at any point, the circuit may be damaged. Therefore circuits often use air or fluid cooling systems to prevent overheating. To ensure that the cooling system is working properly and that the circuit will not be damaged, the temperature of the circuit is monitored.

Heretofore, with air cooling, circuit temperatures have been measured indirectly utilizing sensors measuring the air temperature around potential "hot spots" in the circuit rather than directly measuring the circuit temperature. The temperature of the integrated circuit must then be extrapolated from the sensed air temperature. However, this technique is not entirely satisfactory as a number of variables can affect the air temperature so that the reading may not reflect the true temperature of the integrated circuit. The problem of accuracy is especially difficult when the integrated circuit uses air cooling. Differences in flow and temperature variations in other components may have a significant influence on the air temperature while the temperature of the integrated circuit may vary only slightly.

Sensors have also been imbedded in the circuit board next to the circuit. As with sensing air temperature, this method is indirect and requires extrapolation to give an estimated circuit temperature. Devices for measuring temperature and pressure have heretofore required an added separate circuit to drive the temperature sensor so that extra circuitry is needed along with an additional power source.

It can be seen then that a temperature monitoring system is needed which directly measures temperature of an integrated circuit and which is driven from existing voltage in the integrated circuit.

SUMMARY OF THE INVENTION

The present invention is directed to a method and apparatus for direct measurement of temperature and pressure for integrated circuit boards. According to the present invention, a thermal diode is embedded directly into a functioning integrated circuit. The thermal diode has a voltage which varies inversely with its temperature, so that as the temperature of the diode increases, the voltage across the diode decreases. It can be appreciated that since the diode is part of the integrated circuit, with the diode calibrated, the voltage can be converted back to a corresponding temperature, so that the temperature measurement is direct, rather than indirect by sensing the air around the circuit.

The thermal diode is driven by the existing voltages of the integrated circuit board. Since board voltages are being used, the diode signal can be driven off the board without special adapting components being added.

In conjunction with the thermal diode, an amplification circuit is used to boost the voltage for driving and for improved signal integrity. The amplification circuit is also driven directly from voltages of the circuit so that no additional power sources or specialized adaptation is required for the amplification circuit.

With the present invention, the temperature is directly measured in the circuit, rather than a method of measuring the temperature indirectly by sensing the air temperature around the circuit or placing a sensor on the circuit board and extrapolating the temperature.

In a similar manner, pressure can be determined utilizing an arrangement having pressure sensors with associated circuits and amplification circuits. A pressure sensor detects the air flow prior to cooling the circuit board and then has the signal amplified. Again, circuit board voltages are utilized so that no special adaptation or additional power sources are necessary. The pressure is measured by the sensor and the signal is amplified for driving the signal off-board and to improve signal integrity. The signal can then be converted into a pressure to detect that proper air flow is occurring. With both the air pressure and circuit temperature being measured, it can be determined that the cooling apparatus is functioning correctly. This combination of pressure measurement at the air stream and direct temperature measurement provides for improved monitoring.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

In the drawings, wherein like reference letters and numerals indicate corresponding elements throughout the several views.

DETAILED DESCRIPTION OF THE PREFERRED EMBODIMENT(S)

Figure 1:
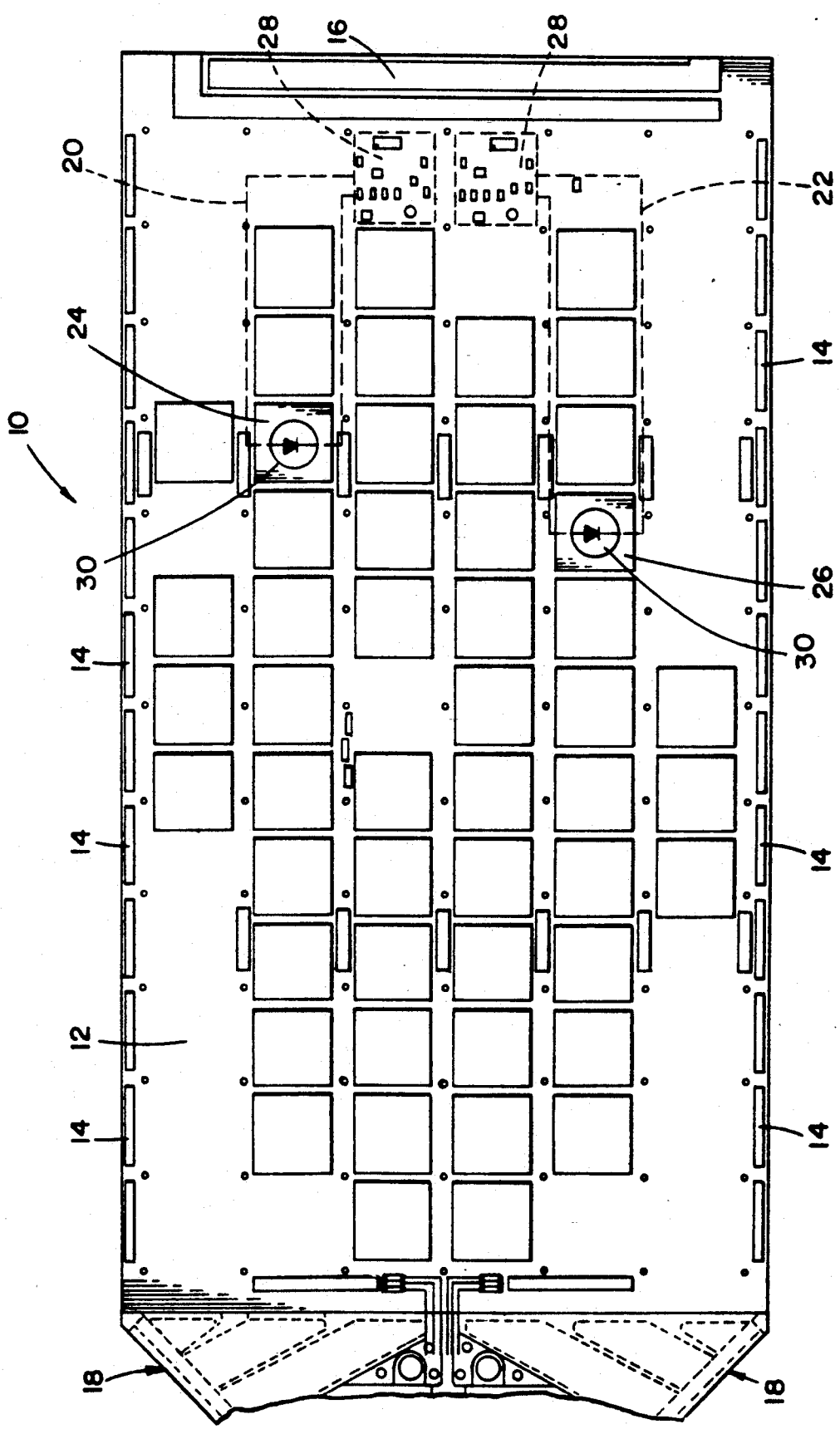
FIG. 1 shows a top plan view of an integrated circuit board having a temperature-sensing apparatus and pressure-sensing apparatus according to the principles of the present invention.

Referring now to the drawings, and in particular referring to FIG. 1, there is shown a printed circuit board 10 which may be part of a circuit board module such as typically is placed in stacks of circuit boards which are used, as for example, with super computers. The printed circuit board 10 has a plurality of integrated circuits placed across a face 12 of the board and a plurality of edge connectors 14 along sides of the board for making electrical connections to other boards and components. In addition, at one end of the board 10 is a bus 16 which is used for power-supply and ground connections while at a second end of the circuit board is duct work 18 directing the cooling air.

Two of the integrated circuits 24 and 26, are selected for direct temperature measurement to give an indication of the temperature on the board 10. Since the cooling air comes in at an end and splits along channels to separate halves of the board 10, the first integrated circuit 24 is selected from integrated circuits on one half of the board and the second integrated circuit 26 is selected from the other half of the board. In this manner, both halves of the board can be sampled for temperature, so that it can be determined that the air flow on both halves of the air duct 18 are functioning correctly. Temperature sensing devices 20 and 22 each have an amplification circuit 28 which boosts the voltage received from a thermal diode 30 in the integrated circuits 24 and 26.

Figure 2:
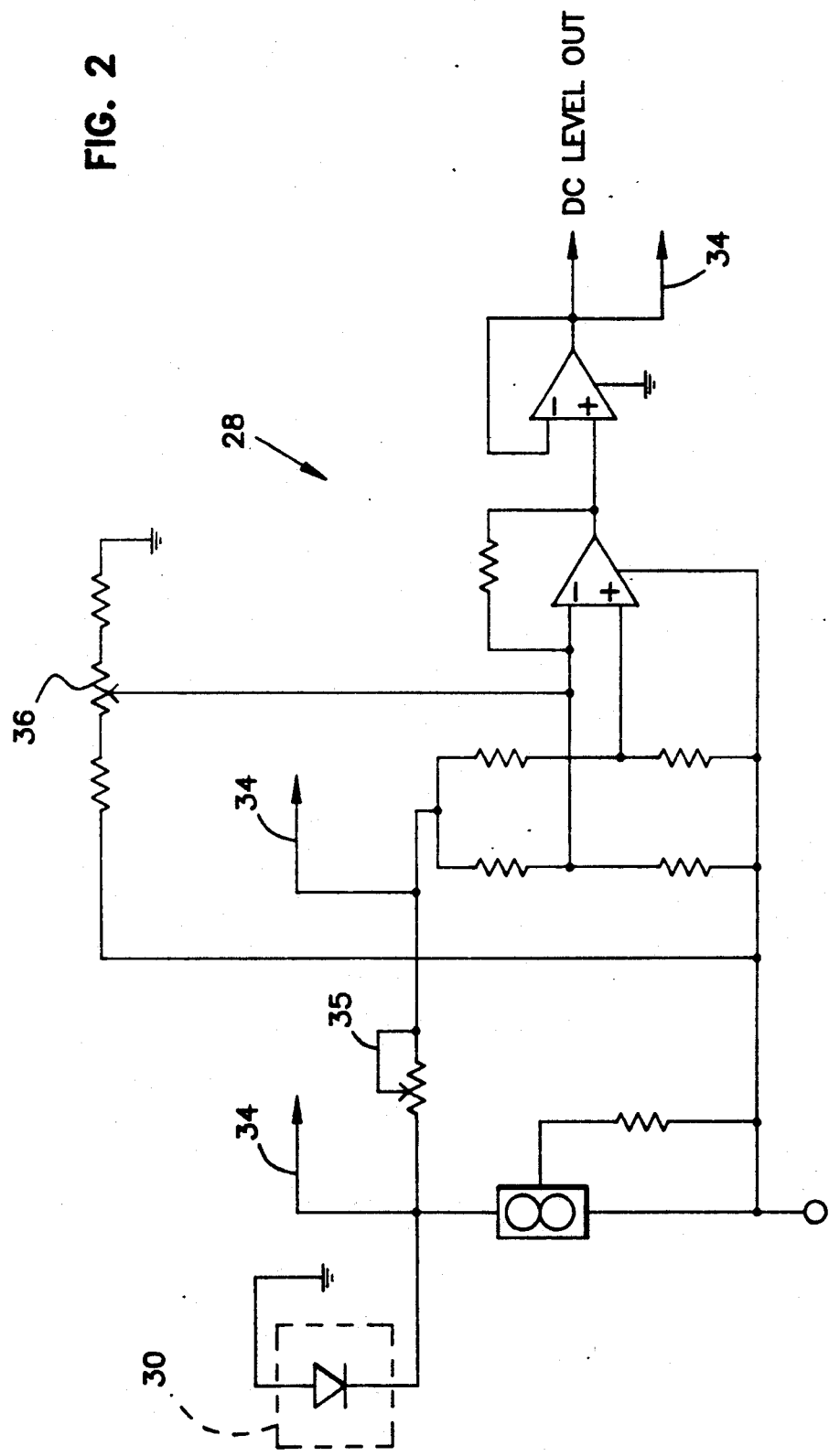
FIG. 2 shows a schematic of an amplification circuit for the temperature-sensing apparatus shown in FIG. 1.

As shown in FIG. 2, the amplification circuit 28 receives a signal from the thermal diode 30 which has a voltage which varies with the temperature. In the preferred embodiment, the initial voltage across the thermal diode 30, $V_i$, at room temperature is 0.8 volts which is amplified to 1.6 volts upon passing through the amplification circuit. The voltage V across the diode can be given by the formula:

$$V_i + X \cdot (T - T_i) = V$$

Where $V_i$ is the voltage across the diode at cold or initial temperature, giving an initial voltage. T is the temperature and $T_i$ is the initializing temperature. X is a coefficient of the variable temperature characteristic of each diode which is determined from calibration.

The coefficient X is given in volts or millivolts per degree Celsius and is negative. A typical diode characteristic is negative 0.00177 volts per degree Celsius. Therefore, as the temperature increases, the voltage V across the diode will drop linearly. Calibration of the diode 30 to adjust the offset is accomplished by utilizing test points 34 remotely sending current through the diode at the cold temperature, typically room temperature. The voltages of the diodes 24 or 26 are all referenced to the same point using an adjustable potentiometer 35. In addition, the gain of the amplification circuit 28 is adjusted using a potentiometer 36. It can be appreciated that in the preferred embodiment, the circuit 28 is driven by power from the board itself to provide sufficient current for sensing and does not require any additional power source to operate or any special circuitry to implement the amplifier. It can also be appreciated that the voltage which is driving the amplification circuit 28 is $-4.5$ volts, the same as the printed circuit board voltage plane in the preferred embodiment, so that the amplification circuit is compatible with the rest of the circuit board 10. In this manner, the temperature can be processed by a logic controller utilizing a fully functioning integrated circuit of the system to obtain a direct temperature reading in the circuit.

Figure 3:
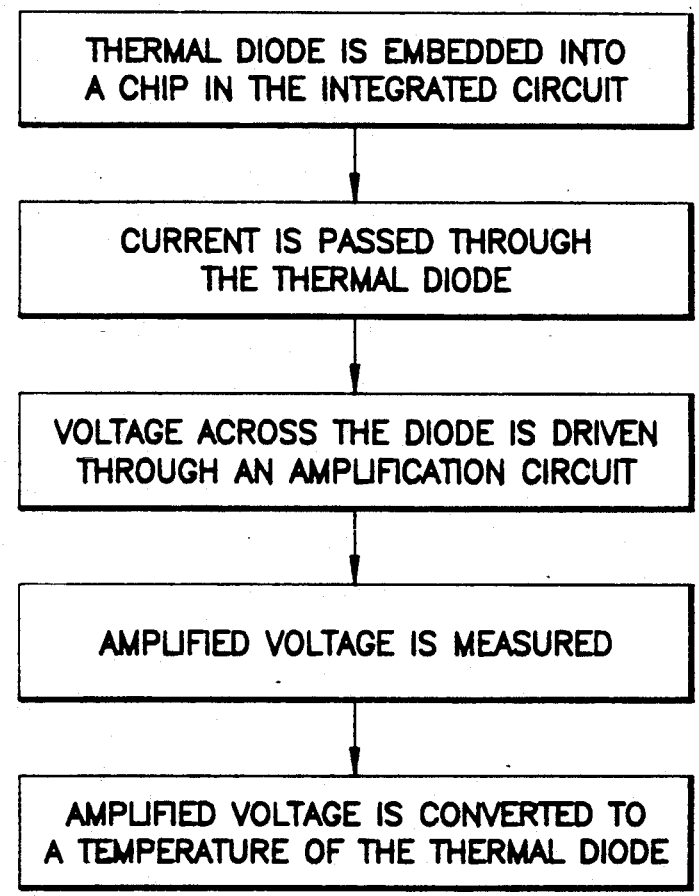
FIG. 3 shows a block diagram of a method of direct temperature measurement.

As shown in FIG. 3, the present method and apparatus for obtaining a directly measured temperature reading utilizes a thermal diode embedded into an integrated circuit. When current is passed through the thermal diode, a voltage is obtained. As the temperature increases, the voltage across the thermal diode will drop. This voltage is then driven through an amplification circuit and the amplified voltage is then measured. Since the initial cold voltage is known and the diode has been calibrated, giving a voltage characteristic for the diode, the amplified voltage which is measured can be converted back to a given temperature. The temperature can be obtained by the formula:

$$T = T_i + (V - V_i)/X$$

In this manner, the voltage is directly measured from within the circuit, rather than working from another temperature and extrapolating, furthermore it does not require additional power sources to drive the circuit. In addition, the power of the circuit is sufficient to drive the voltage off the board so that the temperature-measuring apparatus is compatible with the integrated circuit.

Figure 4:
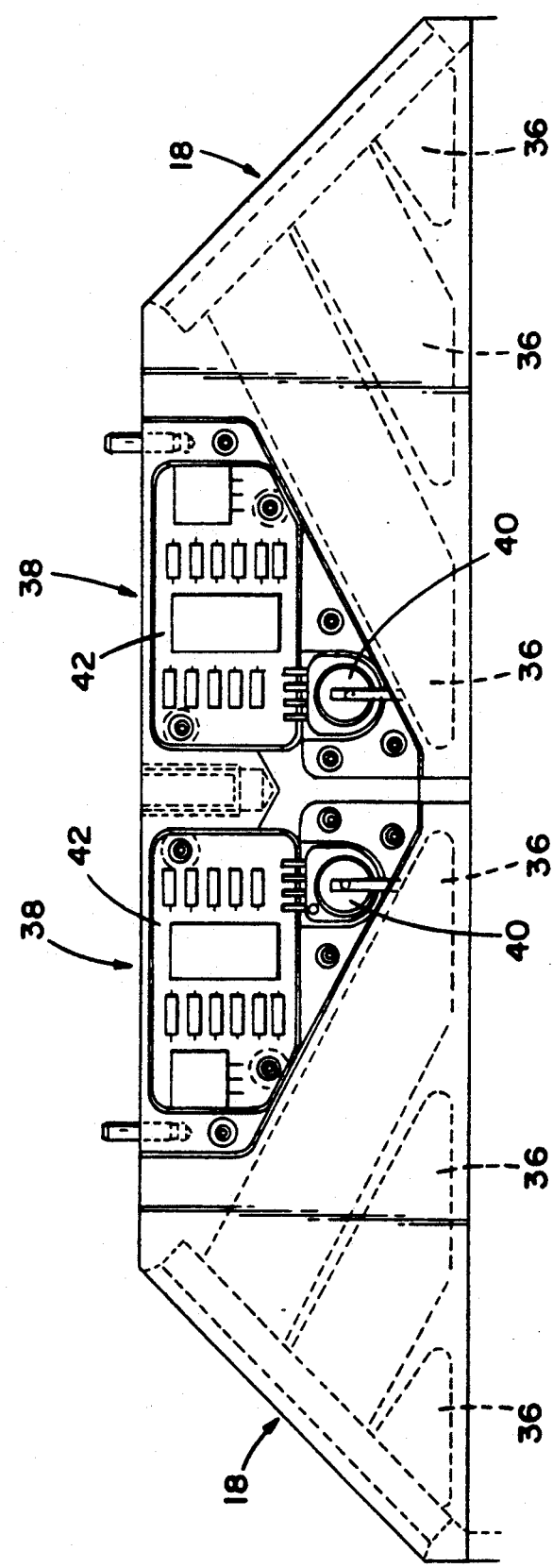
FIG. 4 shows a top plan view of a pressure sensor and associated amplification circuit; and, FIG. 5 shows a schematic of a circuit for the pressure-sensing apparatus.

Referring now to FIG. 4, there is shown a pressure-sensing apparatus 38. The pressure-sensing apparatus 38 includes a temperature-stable pressure sensor 40 and associated amplification circuit 42. The pressure sensors 40 are mounted proximate air channels 36 in duct 18 which direct air for cooling onto the circuit board 10. The pressure sensors 40 utilize a diaphragm which deflects in proportional response to pressure changes. The deflection by each sensor 40 is converted to a proportional signal which may be measured. The signal is converted to a displayed pressure reading which may be monitored or utilized for controlling air flow by a logic controller. The sensors 40 detect the air pressure at the duct 18 prior to the air cooling the circuit board to insure that there are no problems, such as blockage or back pressure buildup, and to insure that proper flow is reaching the printed circuit board 10.

Figure 5:
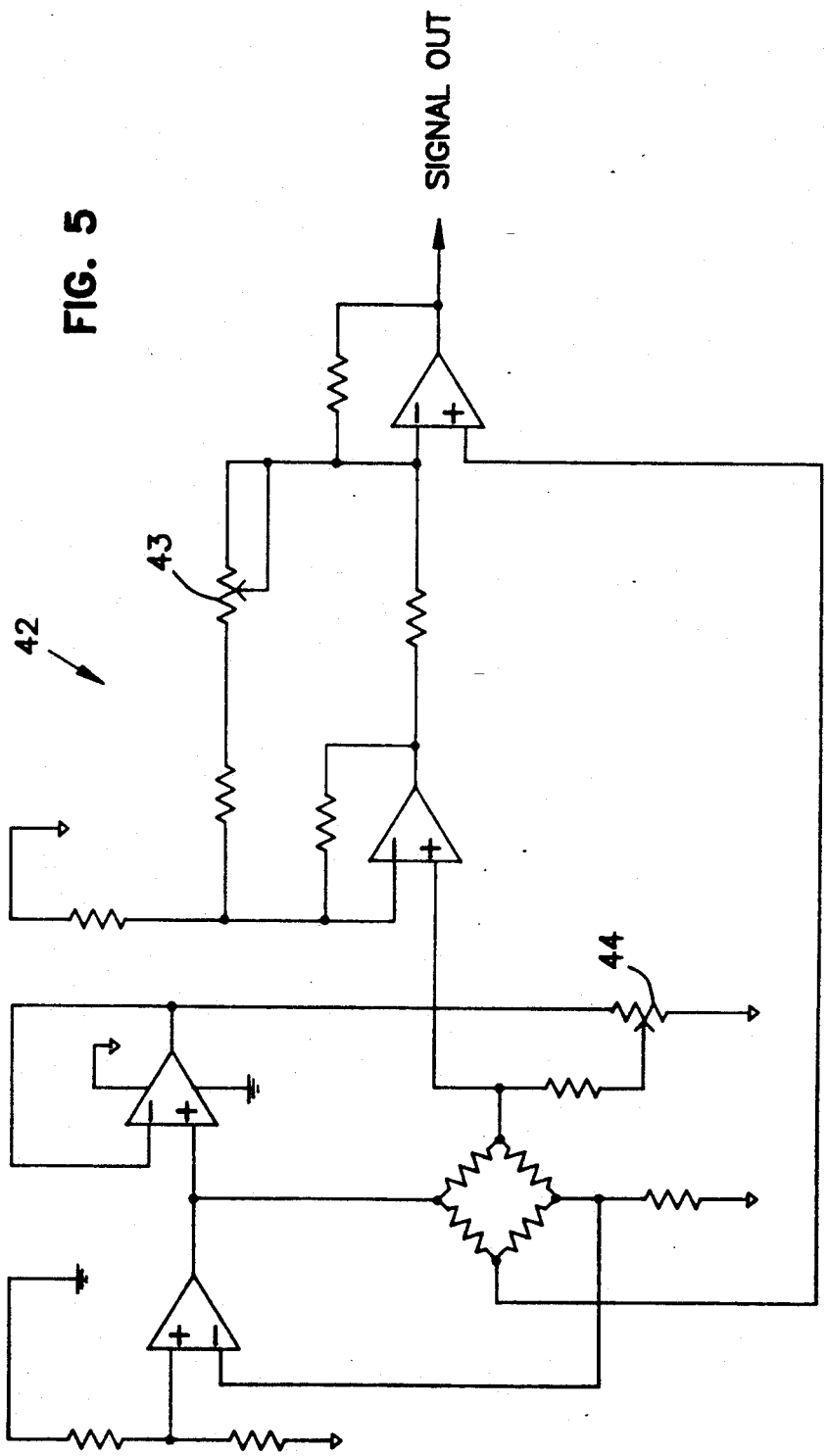

As shown in FIG. 5, the pressure sensor 40 utilizes an accompanying amplification circuit 42. The circuit 42 utilizes a potentiometer 44 so that the signals from the sensors 40 can all be referenced to the same point. Gain of the amplification circuit 42 is changed by adjusting a second potentiometer 43. After passing through the sensor amplification circuit 42, as with the temperature sensors, the signal from the pressure sensor 40 is amplified and driven off-board. The amplification circuit 42 is driven from the power of the circuit boards 10 in a manner similar to the method used for driving the amplification circuit 28 for the temperature sensing apparatus. In this manner, the sensing and amplification circuits can be driven with available power from the board with the same voltages of the board 10. Both the temperature and pressure-sensing apparatuses are easily compatible with the circuit boards with little modification required to directly measure both the temperature and pressure of the circuit boards 10.

The voltage from the thermal diodes 30 and from the pressure sensors 40 are sent through the board and out the edge connectors 14 so that they can be monitored by a logic connectors. The logic controller may then be utilized to make adjustments or send alarms should any problems develop.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. An apparatus for air cooling and directly measuring the temperature of a printed circuit board, comprising:
   a) means for directing cooling air across the printed circuit board;
   b) an integrated circuit mounted on the printed circuit board;
   b) a thermal diode embedded in the integrated circuit, wherein voltage across the thermal diode is inversely proportional to the temperature of the thermal diode;
   d) voltage amplification means for amplifying the voltage from across the thermal diode; and,
   e) voltage measuring means for measuring the amplified voltage from across the thermal diode.

2. An apparatus according to claim 1, wherein the voltage amplification means is powered by integrated circuit voltages.

3. An apparatus according to claim 1, wherein the characteristic of the diode is 0.00177 volts per degree celsius.

4. An apparatus according to claim 1, further comprising a logic controller monitoring the voltage across the thermal diode.

5. An apparatus according to claim 1, wherein two integrated circuits are monitored on each printed circuit board.

6. An apparatus according to claim 1, wherein at room temperature, the voltage amplification means amplifies the voltage to 1.6 volts and drives it off the printed circuit board.

7. An apparatus according to claim 1, wherein the voltage amplification means comprises a voltage amplification circuit mounted on the printed circuit board.

8. An air cooled printed circuit board having a temperature monitoring system, comprising:
   a) voltage sensing means placed on the circuit board, wherein voltage across the voltage sensing means varies inversely with the temperature;
   b) voltage amplifying means driven by voltage of the printed circuit board for amplifying the voltage from across the voltage sensing means;
   c) voltage measuring means for measuring the amplified voltage from across the voltage sensing means; and,
   d) means for directing cooling air across the printed circuit board.

9. A printed circuit board according to claim 8, further comprising voltage conversion means for converting the amplified voltage from across the voltage sensing means to a corresponding circuit temperature.

10. A printed circuit board according to claim 8, wherein the voltage amplifying means comprises a voltage amplification circuit mounted on the printed circuit board.

11. A printed circuit board according to claim 10, wherein the voltage amplification circuit comprises an operational amplifier amplifying the voltage from 0.8 to 1.6 volts at room temperature.

12. A printed circuit board according to claim 8, wherein the amplification means is driven by voltage of the circuit board.

13. A method for cooling a printed circuit board and directly measuring the temperature at points in an integrated circuit of the printed circuit board, comprising the steps of:
   a) providing cooling air across the circuit board;
   b) locating a thermal diode into the integrated circuit, the thermal diode having a voltage characteristic wherein voltage across the thermal diode varies inversely with the temperature of the thermal diode;
   c) amplifying the voltage from across the thermal diode;
   d) measuring the amplified voltage from across the thermal diode; and,
   e) converting the measured amplified voltage to a corresponding temperature.

14. A method according to claim 13, wherein the voltage from across the thermal diode is directed through a voltage amplification circuit.

15. A method according to claim 13, wherein a thermal diode is embedded in two different integrated circuits on the printed circuit board.

16. A method according to claim 15, wherein the voltage from the embedded thermal diode is directed through a voltage amplification circuit.

17. A method according to claim 16, wherein the voltage amplification circuit is driven by printed circuit board voltage planes.

* * * * *

UNITED STATES PATENT AND TRADEMARK OFFICE
CERTIFICATE OF CORRECTION

PATENT NO.   :   5,230,564
DATED        :   July 27, 1993
INVENTOR(S)  :   Bartilson et al.

It is certified that error appears in the above-identified patent and that said Letters Patent is hereby corrected as shown below:

Column 3, line 39, INSERT --and-- after "34"

Column 4, line 54, DELETE "connectors" and INSERT therefor --controller--.

Column 5, line 8, DELETE "b)" and INSERT therefor --c)--

Column 5, line 41, DELETE "voltage" (second occurrence) and INSERT therefor --voltages--

Column 6, line 16, INSERT --voltage-- after "the"

Signed and Sealed this

Thirty-first Day of May, 1994

Attest:

BRUCE LEHMAN

Attesting Officer

Commissioner of Patents and Trademarks